US012377433B2

(12) United States Patent
Eslamian et al.

(10) Patent No.: US 12,377,433 B2
(45) Date of Patent: Aug. 5, 2025

(54) APPARATUS FOR SURFACE TREATMENT OF A WORKPIECE IN A PRODUCTION LINE

(71) Applicant: Innovation Technology Steyr GmbH, Steyr (AT)

(72) Inventors: Alireza Eslamian, Steyr (AT); Martin Schifko, Steyr (AT)

(73) Assignee: Innovation Technology Steyr GmbH, Steyr (AT)

(*) Notice: Subject to any disclaimer, the term of this patent is extended or adjusted under 35 U.S.C. 154(b) by 488 days.

(21) Appl. No.: 17/769,608

(22) PCT Filed: Oct. 14, 2020

(86) PCT No.: PCT/AT2020/060372
§ 371 (c)(1),
(2) Date: Apr. 15, 2022

(87) PCT Pub. No.: WO2021/072470
PCT Pub. Date: Apr. 22, 2021

(65) Prior Publication Data
US 2023/0219111 A1    Jul. 13, 2023

(30) Foreign Application Priority Data

Oct. 16, 2019  (AT) .............................. A 50891/2019

(51) Int. Cl.
*B05C 3/109*    (2006.01)
*B05B 5/00*    (2006.01)
(Continued)

(52) U.S. Cl.
CPC .............. *B05C 3/109* (2013.01); *B05B 5/001* (2013.01); *B05B 5/081* (2013.01); *B05C 3/04* (2013.01); *B05C 15/00* (2013.01); *C23C 16/4585* (2013.01)

(58) Field of Classification Search
CPC ...... C25D 17/18; C25D 17/20; C25D 17/004; C23C 16/4585
(Continued)

(56) References Cited

U.S. PATENT DOCUMENTS 4,039,482 A    8/1977  Hoyer et al.
4,825,598 A *  5/1989  Schlick ...................... B25J 5/06
                                                451/92
(Continued)

FOREIGN PATENT DOCUMENTS

CN    103611660 B    3/2014
CN    106862005 A    6/2017
JP    2012097290 A    5/2012

OTHER PUBLICATIONS

English language abstract for JP 2012-097290 A, May 24, 2012.
English language abstract for CN 106862005 A, Jun. 20, 2017.
English language abstract for CN 103611660 A, Mar. 5, 2014.

Primary Examiner — Karl Kurple
(74) Attorney, Agent, or Firm — Tiajoloff & Kelly LLP

(57) ABSTRACT

An apparatus for surface treatment of a workpiece in a production line comprises a positioning frame (1) for the workpiece to be treated. The positioning frame has a coupling (3) for a positioning drive (4). In order to achieve an increase in the production cadence irrespective of the type of surface treatment without having to accept losses with regard to the surface quality of the coating, a hermetically sealable capsule (2) is supported against the positioning frame (1), which capsule (2) has connection lines (5) for the exchange of operating media with different operating medium supply units (6) arranged along the production line.

16 Claims, 4 Drawing Sheets

Figure 1:
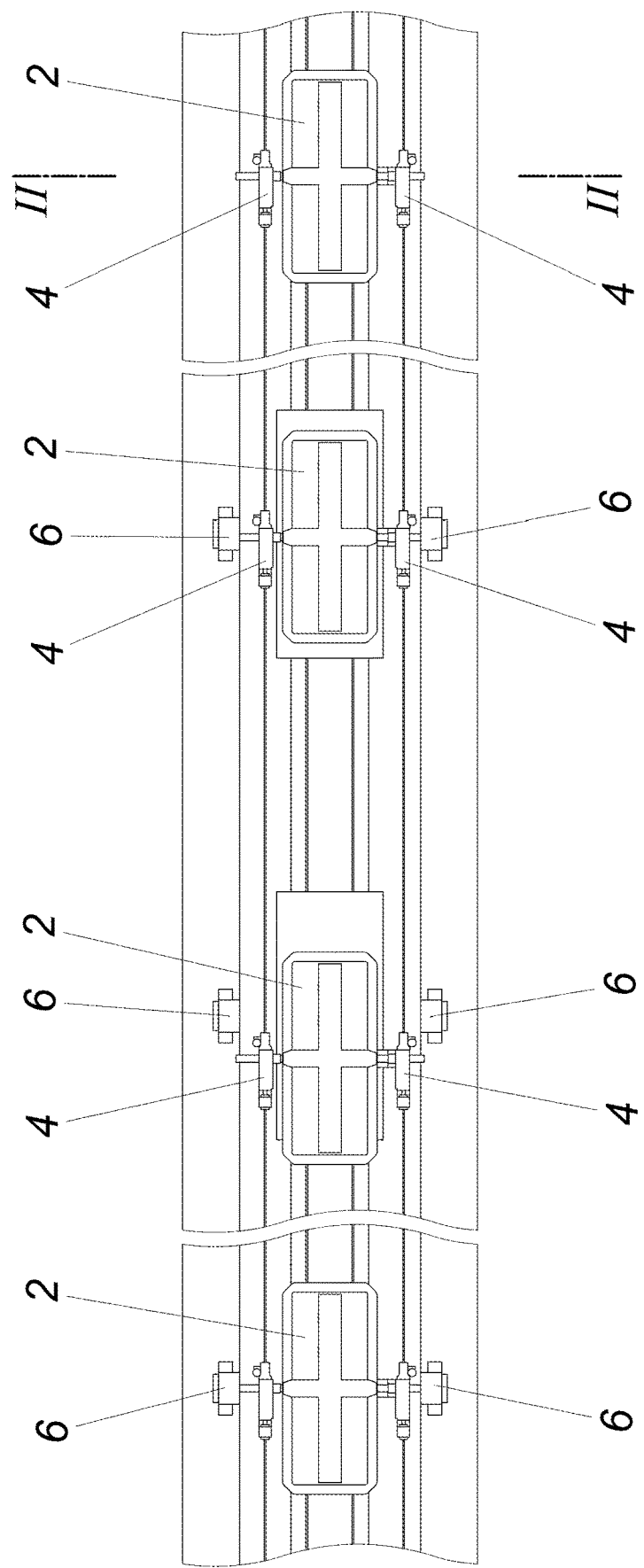

(51) Int. Cl.
  *B05B 5/08* (2006.01)
  *B05C 3/04* (2006.01)
  *B05C 15/00* (2006.01)
  *C23C 16/458* (2006.01)

(58) Field of Classification Search
  USPC .............................. 204/271, 600, 623–625
  See application file for complete search history.

(56) References Cited

U.S. PATENT DOCUMENTS

| | | | | |
|---|---|---|---|---|
| 4,890,567 | A * | 1/1990 | Caduff | B08B 3/12 134/1 |
| 5,367,841 | A * | 11/1994 | Smith | B24C 9/00 451/92 |
| 5,490,917 | A * | 2/1996 | Lazaro | C25D 17/20 204/213 |
| 5,562,810 | A * | 10/1996 | Urquhart | C25D 17/28 204/213 |
| 5,851,368 | A * | 12/1998 | Rumph | C25D 17/20 204/213 |
| 6,471,837 | B1 * | 10/2002 | Hans | C23C 14/566 204/298.25 |
| 7,138,016 | B2 * | 11/2006 | Reardon | H01L 21/67075 118/313 |
| 8,770,143 | B2 * | 7/2014 | Endo | C23C 16/4584 216/37 |
| 9,051,650 | B2 * | 6/2015 | Gresik | C23C 14/205 |
| 9,809,878 | B2 * | 11/2017 | Black | C23C 14/185 |
| 10,060,027 | B2 * | 8/2018 | Parent | B29C 45/0053 |
| 2013/0037407 | A1 * | 2/2013 | Gresik | B65G 47/04 204/298.15 |
| 2013/0119155 | A1 * | 5/2013 | Braspenning | B05B 13/005 239/290 |
| 2013/0243963 | A1 * | 9/2013 | Rina | B05B 13/005 118/712 |
| 2014/0230858 | A1 * | 8/2014 | Sugiura | B08B 9/0821 134/23 |
| 2017/0246652 | A1 | 8/2017 | Ewald et al. | |
| 2018/0066375 | A1 * | 3/2018 | Morgan | C25D 17/16 |
| 2018/0179656 | A1 * | 6/2018 | Okuzono | C25D 17/06 |
| 2019/0249325 | A1 * | 8/2019 | Minami | G01M 3/3281 |
| 2020/0080218 | A1 * | 3/2020 | Okuzono | C25D 21/12 |

* cited by examiner

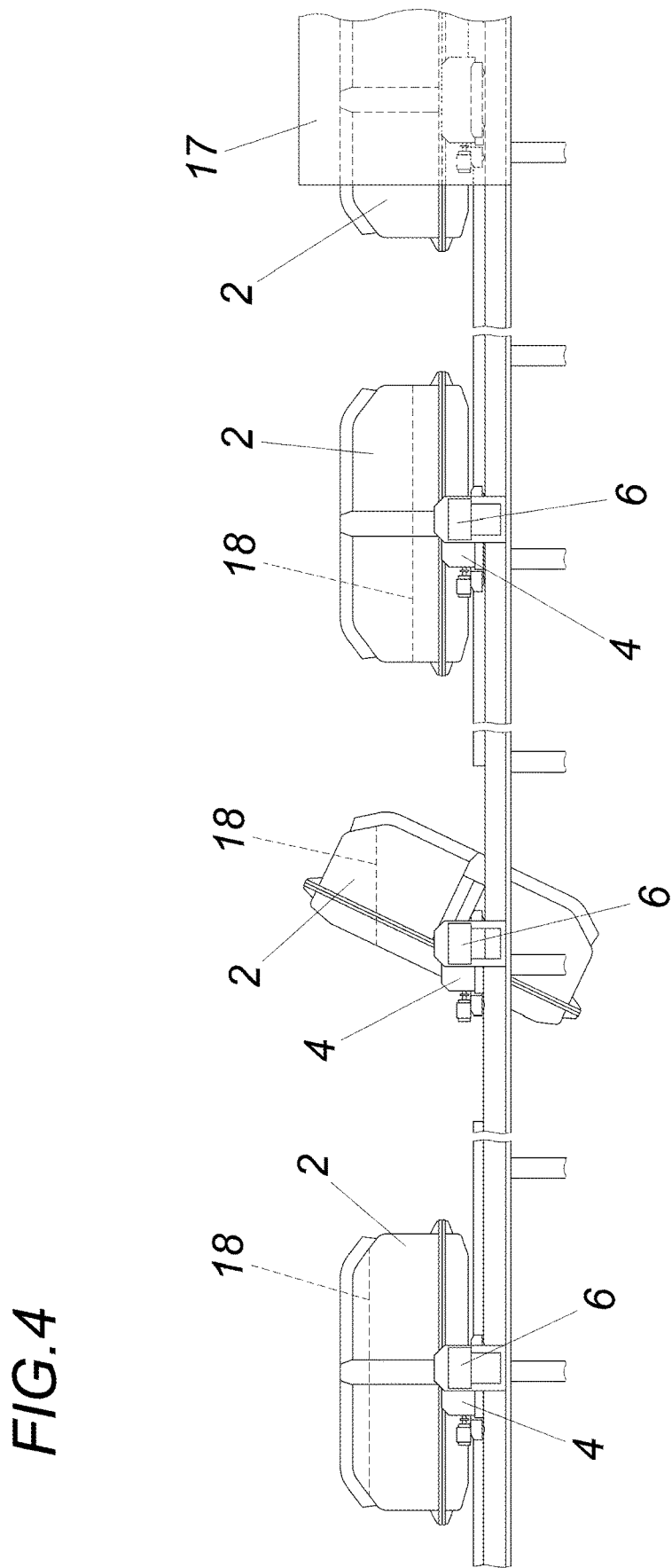

APPARATUS FOR SURFACE TREATMENT OF A WORKPIECE IN A PRODUCTION LINE

FIELD OF THE INVENTION

The invention relates to an apparatus for surface treatment of a workpiece in a production line, comprising a positioning frame for the workpiece to be treated, said positioning frame having a coupling for a positioning drive.

DESCRIPTION OF THE PRIOR ART

An apparatus for surface treatment, in particular for coloring workpieces, is known from US20170246652A1. The apparatus consists of a container which can be hermetically sealed by means of a lid. The container is pierced by several connection lines through which a fluid or powdered surface treatment agent can be fed in or discharged and an overpressure or underpressure can be applied. Furthermore, the container can be heated or cooled via a temperature control element mounted on the outside of the shell. Although the complex design and equipment of the apparatus enable a high quality of surface treatment to be achieved, a coating process carried out in this apparatus reaches its limits, particularly at higher production cadences. Thus, the production cadence can only be increased by parallelizing several apparatuses, which, however, would lead to enormous investment costs due to the technical complexity of the apparatus.

In order to increase production cadences in the surface treatment of workpieces, a production line is disclosed in U.S. Pat. No. 6,471,837. The production line comprises a central distribution chamber which guides the workpieces through various hermetically sealable subchambers. The subchambers can be evacuated and are equipped with different apparatuses, for example cathode atomizers and temperature control elements, depending on the surface treatment process. The disadvantage of this, however, is that such production lines are extremely inflexible with regard to different surface treatment processes, since the subchambers are firmly connected to the distribution chamber. In addition, the large design of the subchambers results on the one hand in relatively high operating costs in order to create homogeneous operating conditions in the entire subchamber by means of evacuation or temperature control, for example, and on the other hand the quality of the coating suffers due to the only limited accessibility and thus only inadequate application of the coating agents to the production goods.

For particularly large workpieces, such as car bodies, electrochemical dipping processes are known from the prior art. For this purpose, the car bodies are arranged on a positioning frame which can be rotated by a positioning drive and are thus immersed in an electrically conductive dip coating. By applying a DC voltage between the car body, which acts as a cathode, and an anode, the dip coating precipitates on the car body and remains there. Particularly in the case of large production cycles, however, this causes the quality of the coating to decline over the course of the day due to contamination of the dip coating and changing particle concentrations in the dip coating tank. In addition, two-phase mixtures occur in such dipping processes, for example due to the introduction of air bubbles, which also reduce the surface treatment quality.

SUMMARY OF THE INVENTION

The invention is thus based on the object of proposing an apparatus and a method for surface treatment of the type described at the beginning, which permits an increase in the production cadence, irrespective of the type of surface treatment, without having to accept losses with regard to the surface quality of the coating.

The invention solves the problem posed by supporting against the positioning frame a hermetically sealable capsule which has connection lines for exchanging operating media with various operating medium supply units arranged along the production line.

As a result of these measures, all the method steps required for surface treatment, be it transport of the workpiece through the production line, pretreatment of the workpiece, application of various operating media, such as substances for surface treatment, to the workpiece, crosslinking of the substances for surface treatment, etc., can be carried out in a capsule sealed off from the environment. Depending on the workpiece, the capsule is dimensioned in such a way that it provides sufficient space to accommodate the workpiece, but still allows the atmosphere enclosed by the capsule (pressure, temperature, humidity, etc.) to be manipulated in a way that is as energy-saving as possible, and thus allows precise control of the process conditions. According to the invention, manipulation of the enclosed atmosphere is carried out by means of connection lines which allow an exchange of operating media between the capsule and operating medium supply units arranged along the production line. Any active process components in the capsule itself are kept to a minimum. The capsule is designed as a reaction chamber for surface treatment of the workpiece and for manipulation of the atmosphere in the capsule. In principle, substances for pretreatment of the workpiece, such as cleaning agents, substances for surface treatment, such as liquid or powder coatings, nanoparticles, but also substances for manipulating the atmosphere, such as hot air, water vapor and the like, can be regarded as operating medium. If the capsule is equipped with simple electrical components, such as a temperature control element, electrical current is used as the operating medium. If the capsule is appropriately designed, electromagnetic radiation can be used as the operating medium for manipulating the atmosphere or the workpiece, which in this case is not conducted through the connection lines. Since the connection lines are suitable not only for filling the capsule with operating media, but likewise for emptying the capsule, a negative pressure or vacuum can be created in the capsule by sucking off air as operating medium. As a result of the use of the hermetically sealable capsule according to the invention, a homogeneous, clean reaction chamber is thus created, which additionally increases work safety for any operators by eliminating escaping operating medium vapors. The operating media are provided by operating medium supply units, which are arranged along the production line, comprise conveying devices for the operating media and provide different operating media depending on the type of surface treatment. The positioning frame with the capsules supported against it is conveyed by a positioning drive which is connected to the positioning frame via a coupling. The positioning drive can be designed independently of the positioning frame, for example as a cable or rail drive, and can be connected to the positioning frame only via a coupling. However, the positioning drive can also be integrated into the positioning frame or, in a particularly preferred embodiment, form a unit separate from the positioning frame.

The capsule can also be used for the insertion and removal process in a dipping process. For this purpose, the workpiece can be arranged in the capsule and the capsule can be evacuated via the connection lines. The evacuated capsule can be immersed in the dip-coating bath via the position drive, whereupon the workpiece is conveyed from the capsule through the dip-coating bath to a second capsule via transport devices. The second capsule can then be closed, evacuated and conveyed out of the dip-coating bath via the positioning drive. By dipping the workpiece in or out of the evacuated capsule, air bubbles can be prevented from entering and thus the formation of undesirable two-phase mixtures which reduce the surface treatment quality.

In order to enable unhindered positioning or transport of the capsule through the production line and yet rapid and reliable coupling to operating medium supply units, it is proposed that the positioning frame forms the connection lines for flow connection with the capsule. Accordingly, the connection lines are not loosely arranged on the capsule, but are guided through the frame. In a structurally particularly favorable design of the invention, the frame itself can be the connection line, so that separate connection lines between the operating medium supply units and the capsule can be avoided and thus the required manufacturing effort can be reduced. For protection against the operating media, for example against oxidation, the frame may have an appropriate internal coating. Regardless of whether the connection lines are routed through the frame or are formed by the frame, twisting or tangling of the connection lines can be prevented and unhindered access to the capsule for inspection activities, for example, can be enabled.

To ensure that the capsules can be coupled to the operating medium supply units quickly and reliably without restricting any possible movement of the capsule for the distribution of the operating media, it is recommended that the connection lines are passed through the coupling for the positioning drive. Both the mechanical connection and the supply of operating media can thus be made via a connection point whose relative position with respect to the operating medium supply units is independent of the relative position of the capsule or the positioning frame. With an appropriate design of the coupling, the connection line thus experiences only low bending moments, which results in a particularly long service life of the connection lines.

In order to be able to move the positioning frames according to the invention with the capsules supported against them between the individual operating medium supply units when the positioning drives are coupled and to be able to couple them easily at each operating medium supply unit, it is proposed that the connection lines are passed through the positioning drive. For example, the drive axis of the positioning drive connected to the positioning frame can be hollow, so that the connection lines can be passed from the positioning frame through the positioning drive within this drive axis.

If the atmosphere in the capsule is to be manipulated during the application of an operating medium for surface treatment, the positioning frame can have a coupling axis connecting two opposite couplings, which forms two separate connection line sections for different operating media for the two couplings. Accordingly, one connection line section can be connected to a first operating medium supply unit which supplies the interior of the capsule with an operating medium for surface treatment or surface pretreatment of the workpiece, whereas the other connection line section can be connected to a second operating medium supply unit which evacuates the capsule, supplies it with a temperature control fluid and/or supplies it with humidity. In this way, two processing steps can be carried out at one processing position, namely during a coupling to two operating medium supply units located opposite each other.

In order to achieve complete application of the operating media to the workpiece and to prevent sedimentation of various particles in the operating media, it is proposed that the coupling axis connecting two opposing couplings forms an axis of rotation for the positioning frame for uniform distribution of the operating media in the capsule. A positioning drive of the positioning frame can thus be provided not only for translational movement of the capsule through a production line, but also for rotation of the capsule about the coupling axis. Two separate positioning drives can be provided for this purpose, or a single positioning drive can be provided which enables both translational movement of the capsule and rotation about the coupling axis as a horizontal axis of rotation.

Energy-saving transport of the capsule through the production line can be achieved if the positioning frame has a chassis that is independent of the positioning drive. While the positioning drive can be guided on rails, for example, the chassis of the positioning frame can have a set of rollers for transferring the loads, which can relieve the couplings and increase their service life.

Particularly favorable conditions for loading the capsules with the workpieces to be treated arise when the height of the upper part of the capsule exceeds the height of the lower part of the capsule supported on the positioning frame. Preferably, the positioning frame forms a unit with the lower part of the capsule, onto which the workpiece is placed and fixed with the positioning frame inside the lower part of the capsule, whereupon the upper part of the capsule is placed onto the lower part of the capsule and the capsule is thus hermetically sealed.

In order to enable an electrical supply to any components arranged in the capsule interior without impairing the detachability of the capsule, it is advisable for the capsule upper part to be connectable to the capsule lower part via a flange which surrounds the capsule and has electrical contacts. The arrangement according to the invention nevertheless protects the contacts from corrosion, accelerated by any operating media in the capsule interior or other environmental influences.

For a process-safe exchange of operating media between the capsule and the operating medium supply units, the upper part of the capsule can have inlet valves connected to the connection lines and the lower part of the capsule can have outlet valves for operating media connected to the connection lines. This enables uniform application of the operating media to the workpiece and, at the same time, extraction of the same without leaving any residue. The inlet valves can vary depending on the surface finishing process. If the apparatus is used for powder coating, for example, the inlet valves can have rotary bells, finger nozzles, impact plate nozzles and/or flat spray nozzles.

If the lower part of the capsule is penetrated by the positioning frame, this not only results in particularly compact design conditions, but if the connection lines are appropriately designed, liquid operating media can also be removed from the capsule in a favorable manner.

The invention also relates to a method for surface treatment of a workpiece moved on a positioning frame by positioning drives in a production line. In order to minimize the consumption of resources for the method without lowering the production cadence or production quality, it is proposed that the workpiece is arranged in a hermetically sealable capsule, whereupon the sealed capsule supported on the positioning frame is conveyed step by step by positioning drives to various operating medium supply units of a production line, coupled in each case, supplied with resources and uncoupled again. Depending on the type of surface treatment, the operating medium supply units can comprise different operating media. For example, if the surface treatment process is an electrophoretic deposition process, the first operating medium supply unit can apply a cleaning agent to the capsule interior to remove grease or paint residues adhering to the workpiece. After the cleaning agent has been removed by the operating medium supply unit, the capsule is uncoupled and conveyed with the aid of the positioning drive of the positioning frame to a further operating medium supply unit, which fills the capsule interior with an electrolyte for generating a conversion layer on the workpiece, for example, and then empties it again. A third operating medium supply unit can supply the capsule interior with electrically conductive liquid paint for coating the workpiece. A DC voltage field is now applied between the workpiece, which is connected as a cathode, for example, and an anode mounted in the capsule, causing the paint particles on the workpiece to precipitate. It probably does not need to be mentioned further that the workpiece can also be connected as an anode. In this case, a cathode must be arranged in the capsule. In a final method step, the applied coating is crosslinked. This can be carried out, for example, by supplying hot air from a further operating medium supply unit or by a temperature control element. Since the apparatus has several connection lines for simultaneous application of different operating media, the process conditions, i.e. the temperature, pressure and humidity, can be influenced during each method step.

In order to enable the most uniform possible application of the operating media, even at points on the workpiece that are difficult to access, the capsule to which the operating media are applied can be rotated about a horizontal axis of rotation. The rotation can take place before, during and/or after the application.

In order to create homogeneous and energy-saving crosslinking of surface treatment agents applied to the workpieces, it is advisable for at least one agent to have dielectrically or inductively excitable particles and for the electromagnetically permeable capsule to be guided through an electromagnetic field in order to heat the particles. In principle, the particles can already be part of the operating media for surface treatment, as is the case, for example, with metallic pigments of powder or liquid coatings. Alternatively, dielectrically or inductively excitable particles can be conveyed into the capsule in a further method step as part of a curing agent. If the particles are now excited by the electromagnetic radiation of an electromagnetic field, they heat up. The heat thus generated can be used to fix the coatings, hence to evaporate the solvents contained in the liquid coating, or to crosslink the powder coatings. It has been found that, because of their sufficient penetration depth, electromagnetic fields with a frequency of 30 kHz to 300 MHz are particularly well suited to excite the particles in the capsule and to generate the desired curing temperatures of preferably 150 to 200° C. The method according to the invention does not heat the workpiece, but only the layer containing the dielectrically or inductively excitable particles, which means that the desired temperature conditions can be quickly achieved and precisely controlled. Complete fixation of different coatings can be achieved if the particles are exposed to the electromagnetic field for about 5 to 50 minutes. Initial calculations have shown that this can save 90% of the drying energy compared with drying processes known from the prior art.

BRIEF DESCRIPTION OF THE INVENTION

Figure 2:
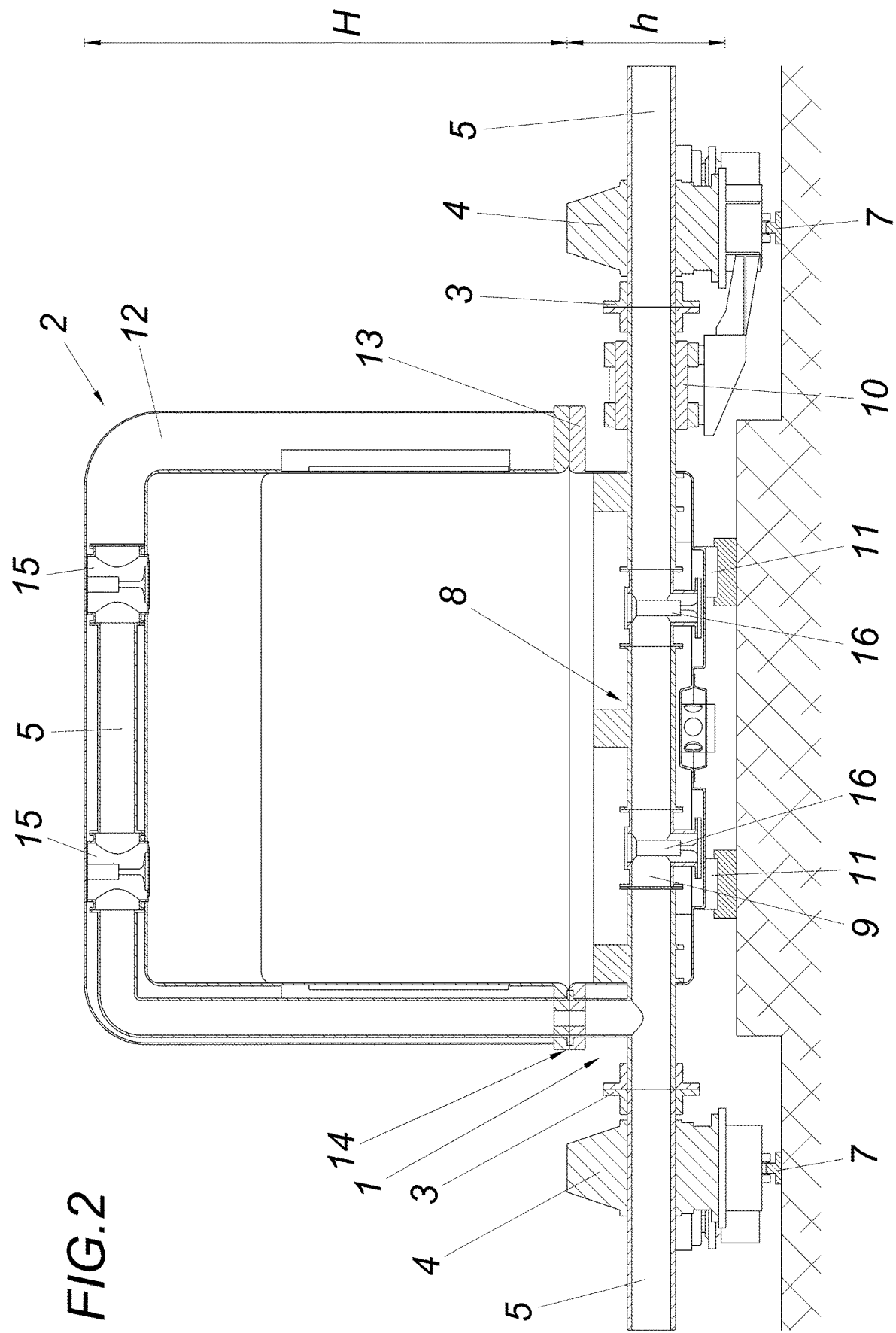
Figure 3:
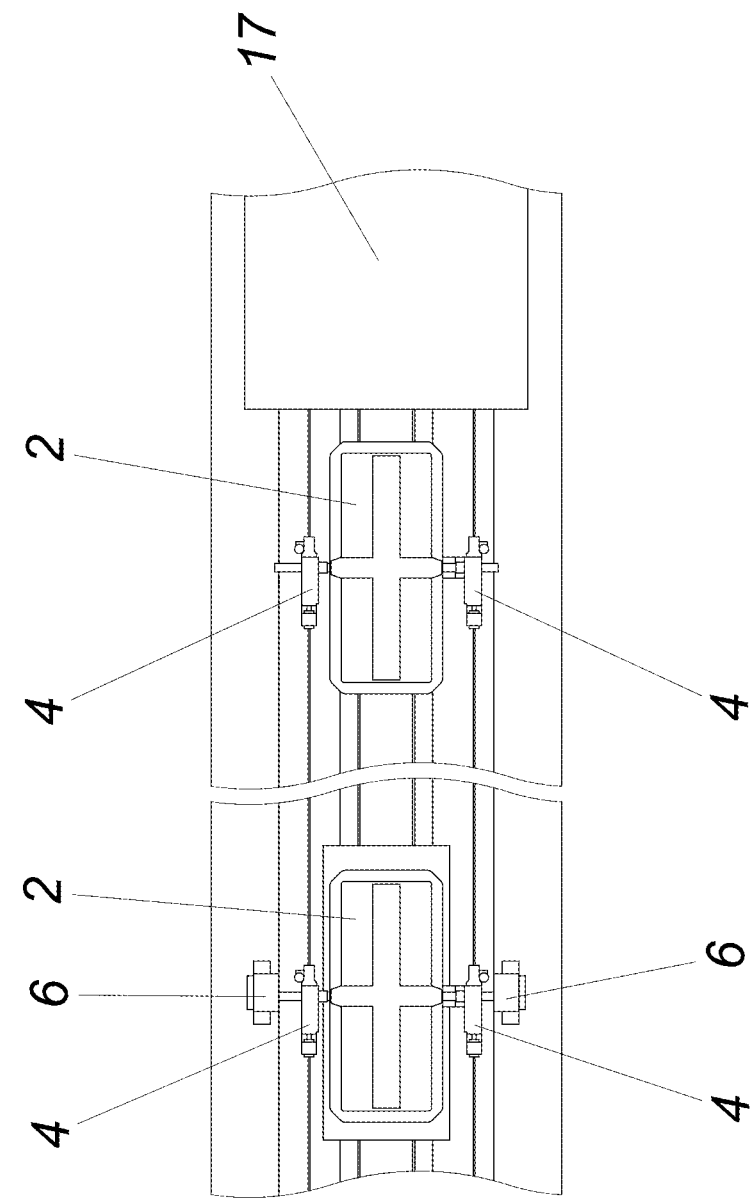

In the drawing, the subject matter of the invention is shown by way of example, wherein:

FIG. 1 shows a top view of a production line having several apparatuses for surface treatment and operating medium supply units according to the invention, FIG. 2 shows a schematic section along line II-II in enlarged scale, FIG. 3 shows a top view of a production line having two apparatuses for surface treatment according to the invention and an emitter for generating an electromagnetic alternating field, and FIG. 4 shows a side view of a production line having several apparatuses for surface treatment and operating medium supply units according to the invention.

DETAILED DESCRIPTION OF THE PREFERRED EMBODIMENTS

An apparatus according to the invention for surface treatment of a workpiece has, as can be seen in particular in FIG. 2, a capsule 2 supported on a positioning frame 1. To enable the capsule 2 to be conveyed along a production line shown in FIG. 1, the positioning frame 1 is connected to a positioning drive 4 via a coupling 3. As can be further seen from FIG. 2, two positioning drives 4 can also be provided, each of which is connected to the positioning frame 1 via a coupling 3. The capsule 2 can be hermetically sealed, creating a reaction chamber that is sealed off from the environment. By keeping the reaction chamber as small as possible, a particularly resource-saving surface treatment can be made possible, since the process conditions can already be influenced and optimized by small flows of operating media. The manipulation of the atmosphere or the control of the process conditions in the reaction chamber and the application of operating media for surface treatment to the reaction chamber is carried out via connection lines 5, which connect the capsule 2 fluidically to operating medium supply units 6 arranged along the production line. The operating medium supply units can supply the capsule 2 with different operating media depending on the type of surface treatment, which means that the production line can be used for different surface treatment processes without the need for complex design measures.

As disclosed in particular in FIG. 2, the positioning frame 1 itself may be part of the connection lines 5, thereby achieving a simple flow connection between the capsule 2 and the operating medium supply units 6. As a result of these measures, there are no exposed connection lines 5 that could interfere with independent positioning, conveying, or an accessibility of or to the capsule 2.

In order to enable the capsule 2 to be coupled quickly to the operating medium supply units 6 and still move freely, the connection lines 5 are routed through the coupling 3 and the positioning drive 4. The positioning drives 4, which among other things have the task of moving the apparatus stepwise through the production line, can be mounted on rails 7.

If the capsule 2 is to be supplied with several operating media at the same time or if the process conditions, for example pressure, temperature and/or humidity, are to be influenced simultaneously during the supply with an operating medium without impairing the free mobility of the capsule 2, the positioning frame 1 can have a coupling axis 8 mechanically connecting the two couplings 3. The coupling axis 8 thereby forms two connection line sections separated from each other by a stop valve 9.

The coupling axis 8 acts as a horizontal axis of rotation, whereby the capsule 2 can be rotated by a rotary drive 10 of the positioning drive 4. This allows any operating media in the interior of the capsule, i.e. in the reaction chamber, to be evenly distributed and homogeneously applied to the workpiece, which is not shown.

For assisted displacement of the apparatus according to the invention along the production line, the positioning frame 1 may have a chassis 11 comprising rollers.

The capsule 2 can be loaded with a workpiece in a particularly simple manner if the height H of the capsule upper part 12 exceeds the height h of the capsule lower part 13.

In order that a safe electrical contact can be achieved despite the detachable connection between capsule upper part 12 and capsule lower part 13, without any wiring hindering the free positioning of the capsule 2, the capsule upper part 12 and the capsule lower part 13 are connected to each other via a flange 14. The flange 14 has electrical contacts for this purpose which are not shown.

To ensure the reliable supply and discharge of operating media to and from the capsule 2, the capsule upper part 12 has inlet valves 15 connected to the connection lines 5 and the capsule lower part 13 has outlet valves 16. In this embodiment, the stop valve 9 thus also performs the function of an outlet valve 16. The positioning frame 1 together with the outlet valves 16 can pass through the capsule lower part 13.

FIG. 3 shows an emitter 17 for generating an electromagnetic alternating field by which dielectrically or inductively excitable particles contained in an operating medium, for example metallic pigments of a powder or liquid coating, or any nanoparticles, are excited and subsequently heated. The heat generated can be used to crosslink the operating media applied to the workpieces.

In FIG. 4, the possibility of rotating the capsule 2 about a horizontal axis of rotation is shown by way of example. The dashed lines 18 indicate different filling levels of the operating media during filling or pumping down by the operating medium supply units 6.

The invention claimed is:

1. An apparatus for a surface treatment of a workpiece in a production line, said apparatus comprising:
   a positioning frame that has a first coupling connected with a positioning drive and a capsule that is hermetically sealable supported against the positioning frame so as to provide a sealed interior;
   wherein said workpiece is arranged on the positioning frame in the sealed interior of the capsule;
   wherein said positioning drive conveys the positioning frame with the capsule supported against the positioning frame;
   said workpiece on the positioning frame being moved by the positioning drive; and
   wherein the capsule has connection lines communicating with the sealed interior and exchanging operating media with different operating medium supply units arranged along the production line, and supplying said operating media to the sealed interior of the capsule.

2. The apparatus according to claim 1, wherein the positioning frame forms a flow connection with the connection lines with the capsule.

3. The apparatus according to claim 1, wherein the connection lines extend through the coupling.

4. The apparatus according to claim 3, wherein the connection lines extend through the positioning drive.

5. The apparatus according to claim 1, wherein the apparatus has a second coupling, and the couplings oppose each other, and the positioning frame has a coupling axis that connects the first coupling and the second coupling, and the coupling axis forms two separate connection line sections for different operating media for either of the first coupling and the second coupling.

6. The apparatus according to claim 1, wherein the apparatus has a second coupling, and the couplings oppose each other with a coupling axis connecting the two opposing couplings that forms an axis of rotation for the positioning frame that provides uniform distribution of the operating media in the capsule.

7. The apparatus according to claim 1, wherein the positioning frame has a chassis independent of the positioning drive.

8. The apparatus according to claim 1, wherein the capsule has a capsule upper part and a capsule lower part each having a respective height, wherein the height of the capsule upper part exceeds the height of the capsule lower part, which is supported on the positioning frame.

9. The apparatus according to claim 8, wherein the capsule upper part is configured to be connected to the capsule lower part via a flange having electrical contacts extending around the capsule.

10. The apparatus according to claim 8, wherein the capsule upper part has inlet valves receiving the operating media connected to the connection lines and the capsule lower part has outlet valves releasing the operating media connected to the connection lines.

11. The apparatus according to claim 8, wherein a portion of the positioning frame extends into the lower capsule part.

12. An apparatus providing a surface treatment of a workpiece in a production line, said apparatus comprising:
   a capsule that is hermetically sealable;
   said capsule receiving the workpiece therein;
   a positioning frame supporting the capsule thereon so as to provide a sealed interior;
   the positioning frame having a first coupling connected therewith and a positioning drive positioning the positioning frame and the capsule;
   a plurality of operating medium supply units arranged along the production line each having a respective operating medium therein; and
   wherein the capsule has connection lines communicating with the sealed interior and exchanging operating media with each of the operating medium supply units as the positioning frame is positioned so as to connect with the respective operating medium supply unit, said connection lines supplying the operating media of connected operating medium supply units to the sealed interior of the capsule.

13. The apparatus according to claim 12, wherein the operating medium of a connected one of the operating medium supply units flows through a part of the positioning frame to the capsule.

14. The apparatus according to claim 12, wherein the connection lines extend through the coupling and through the positioning drive.

15. The apparatus according to claim 12, wherein the coupling has a coupling axis and the positioning frame is supported for rotation with the capsule about the coupling axis so as to uniformly distribute the operating medium in the capsule.

16. The apparatus according to claim 12 wherein the apparatus has a second coupling, and the couplings form a pair of opposed couplings with a coupling axis, wherein one of the couplings supplies the operating medium of one of the operating medium supply units to the capsule, and the other of the couplings withdraws the operating medium from the capsule.

\* \* \* \* \*